(12) United States Patent
Liao et al.

(10) Patent No.: US 9,324,578 B2
(45) Date of Patent: Apr. 26, 2016

(54) HARD MASK RESHAPING

(71) Applicant: TAIWAN SEMICONDUCTOR MANUFACTURING COMPANY LIMITED, Hsin-Chu (TW)

(72) Inventors: Han-Wen Liao, Taichung (TW); Chih-Yu Lin, Tainan (TW); Cherng-Chang Tsuei, Hsin-Chu (TW)

(73) Assignee: Taiwan Semiconductor Manufacturing Company Limited, Hsin-Chu ( * ) Notice: Subject to any disclaimer, the term of this patent is extended or adjusted under 35 U.S.C. 154(b) by 0 days.

(21) Appl. No.: 14/167,068

(22) Filed: Jan. 29, 2014

(65) Prior Publication Data

US 2015/0214063 A1   Jul. 30, 2015

(51) Int. Cl.
| | |
|---|---|
| *H01L 21/3213* | (2006.01) |
| *H01L 21/033* | (2006.01) |
| *H01L 21/02* | (2006.01) |
| *H01L 21/311* | (2006.01) |

(52) U.S. Cl.
CPC ...... *H01L 21/32139* (2013.01); *H01L 21/0337* (2013.01); *H01L 21/02164* (2013.01); *H01L 21/02274* (2013.01); *H01L 21/31116* (2013.01)

(58) Field of Classification Search
CPC ............ H01L 21/4763; H01L 21/3085; H01L 21/3086; H01L 21/67063
USPC .................................. 438/253, 637, 689, 703
See application file for complete search history.

(56) References Cited

U.S. PATENT DOCUMENTS

| | | | |
|---|---|---|---|
| 7,459,363 B2 * | 12/2008 | Subramanian | 438/253 |
| 9,064,741 B1 * | 6/2015 | Wu et al. | |
| 2004/0198065 A1 * | 10/2004 | Lee et al. | 438/725 |
| 2006/0134917 A1 | 6/2006 | Huang et al. | |
| 2007/0196980 A1 | 8/2007 | Subramanian | |
| 2008/0023803 A1 * | 1/2008 | Shi et al. | 257/623 |
| 2009/0004875 A1 * | 1/2009 | Shen et al. | 438/735 |
| 2009/0075181 A1 * | 3/2009 | Ha | 430/5 |
| 2009/0163028 A1 * | 6/2009 | Jung | 438/703 |
| 2011/0189615 A1 * | 8/2011 | Hou et al. | 430/313 |

OTHER PUBLICATIONS

Corresponding Taiwan Application, Taiwan Office action dated Nov. 10, 2015, 5 pages.

* cited by examiner

*Primary Examiner* — Phuc Dang
(74) *Attorney, Agent, or Firm* — Cooper Legal Group, LLC

(57) ABSTRACT

One or more systems and methods for reshaping a hard mask are provided. A semiconductor arrangement comprises one or more structures formed from a layer according to a target dimension, such as a width criterion, a length criterion, a spacing criterion, or other design constraints. To form such a structure, a hard mask is formed over the layer. Responsive to a dimension, such as a width, of the hard mask not corresponding to the target dimension, a first hard mask portion is modified to create a modified hard mask comprising a modified first hard mask portion. In some embodiments, the first hard mask portion is trimmed to decrease the dimension or coated with a coating material to increase the dimension. An etch of the layer is performed through the modified hard mask to create an etched layer comprising an etched portion, such as the structure, corresponding to the target dimension.

20 Claims, 11 Drawing Sheets

HARD MASK RESHAPING

BACKGROUND

Semiconductor arrangements, such as integrated circuits, comprise structures that perform various functionality. For example, a gate structure of a transistor controls current flowing through a channel of the transistor, generally to serve as a switch within an integrated circuit. Etching processes and masks are used to define and form structures of a semiconductor arrangement. In an example, a mask is formed over a layer of material. An etching process is performed through the mask to etch portions of the layer not protected by the mask. In this way, portions of the layer are etched away to define a structure for the semiconductor arrangement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
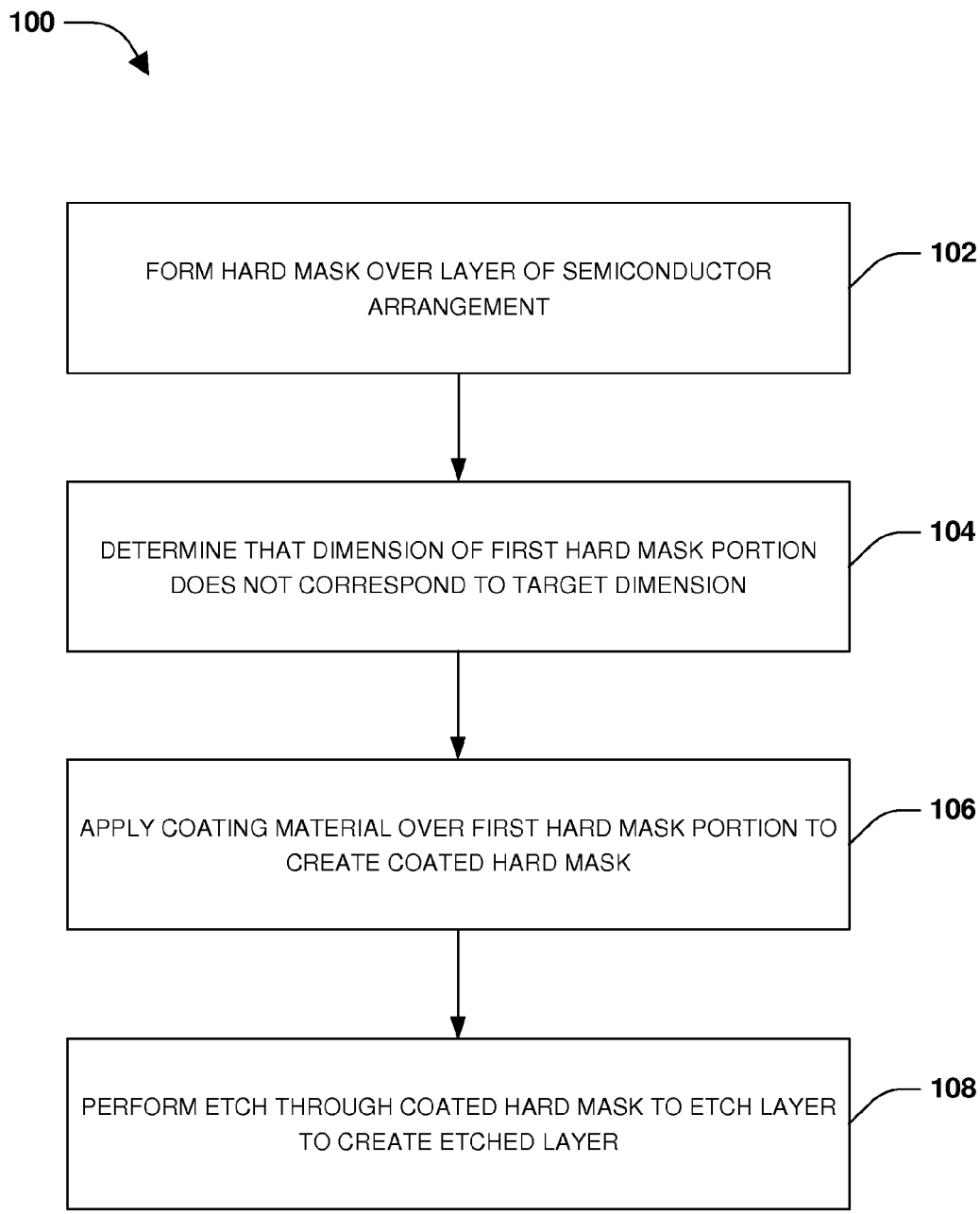
FIG. 1 is a flow diagram illustrating a method of reshaping a hard mask, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more systems and techniques for reshaping a hard mask are provided. A hard mask is used during an etching process to protect portions of a layer from being removed by the etching process. The layer is etched to form structures of a semiconductor arrangement. In some embodiments, a poly layer is etched to form one or more gate structures of transistors. A target dimension, such as a width, a length, a distance between two structures, or other design constraint, is specified for a structure. If the hard mask has a dimension that does not correspond to the target dimension, such as a width dimension that is too large or too small, then the structure will be formed out of spec. Many times out of spec hard masks and wafers are scrapped, resulting in wasted material, time, and cost. Accordingly, as provided herein, the hard mask is reshaped according to the target dimension so that the structure is formed according to the target dimension, as opposed to scrapping the hard mask or incorrectly forming the structure on a wafer that will be scrapped. In some embodiments, the hard mask is coated with a coating layer to increase a dimension of the hard mask to match the target dimension. In some embodiments, the hard mask is trimmed to decrease a dimension of the hard mask to match the target dimension. In this way, the hard mask is reshaped according to the target dimension so that the hard mask can be used for correctly forming the structure.

A method 100 of reshaping a hard mask is illustrated in FIG. 1. At 102, a hard mask is formed over a layer of a semiconductor arrangement. The hard mask comprises one or more hard mask portions, such as a first hard mask portion. In some embodiments, the semiconductor arrangement comprises an electrical component, such as a transistor or FinFET device. In some embodiments, the layer comprises a source material, a drain material, poly, metal, oxide, silicon nitride, or other material. In some embodiments of forming the hard mask, an initial hard mask is formed over the layer. An initial etch of the initial hard mask is performed to form the hard mask. The hard mask is used in conjunction with one or more etching processes, such as a single patterning etch, a double patterning etch, or a multiple patterning etch, to define and form one or more structures from material of the layer.

At 104, a dimension of the first hard mask portion is determined as not corresponding to a target dimension. In some embodiments, the target dimension corresponds to a design constraint, such as a width constraint, a length constraint, or a spacing constraint between structures. In some embodiments, the target dimension is specified by a designer of the semiconductor arrangement. In some embodiments, the dimension is determined as being smaller than the target dimension. If the dimension of the first hard mask portion does not correspond to the target dimension, then an etching process will incorrectly form one or more structures that do not match/satisfy the target dimension.

At 106, a coating material is applied over the first hard mask portion to create a coated hard mask comprising a coated first hard mask portion. In some embodiments, a critical dimensions pull back (CDPB) technique is performed to create the coated hard mask. In some embodiments, the coating material is applied in-situ, such as in an etching chamber within which the layer is to be etched or a chamber within which the layer or hard mask was formed. In some embodiments, the coating material is applied ex-situ such as in a coating chamber. In some embodiments, the coating material comprises Si3N4, SiO2, Carbon, or other polymer formation. The coated hard mask comprises a coated dimension, such as an increased width dimension corresponding to a width of the first hard mask portion and a width added to the first hard mask portion by the coating material. In some embodiments where the coated dimension is larger than the target dimension, the coated first hard mask portion is trimmed, such as by a plasma etch such as $HF_3$ or $NF_3$, based upon the target dimension. In this way, the hard mask is reshaped as the coated hard mask.

At 108, responsive to determining that the coated dimension of the coated first hard mask portion corresponds to the target dimension, an etch is performed through the coated hard mask to etch the layer to create an etched layer. The etched layer, such as a structure formed by remaining material of the etched layer, has an etched layer dimension corresponding to the target dimension. In this way, one or more structures are formed within the etched layer according to spec, such as according to the target dimension.

In some embodiments, a coating process is performed based upon a critical dimension (CD) map. In some embodiments, the coating process comprises a pressure of about 5 millitorr to about 15 millitorr, a plasma power (TCP power) of about 1000 Watts to about 1500 Watts, about 40 sccm to about 60 sccm of $SiCl_4$, about 80 sccm to about 120 sccm of $O_2$, and a temperature of about 50 degrees Celsius to about 70 degrees Celsius. A trim process is performed after the coating process to create a CDPB map. In some embodiments, the trim process comprises a pressure of about 3 millitorr to about 8 millitorr, a plasma power (TCP power) of about 400 Watts to about 600 Watts, about 70 sccm to about 90 sccm of $CF_4$, about 15 sccm to about 25 sccm of $CHF_3$, and one or more temperatures such as about 64 degrees Celsius, about 60 degrees Celsius, about 54 degrees Celsius, and about 52 degrees Celsius. The trim process may compensate for the coating process so that the CDPB map is relatively uniform.

Figure 2A:
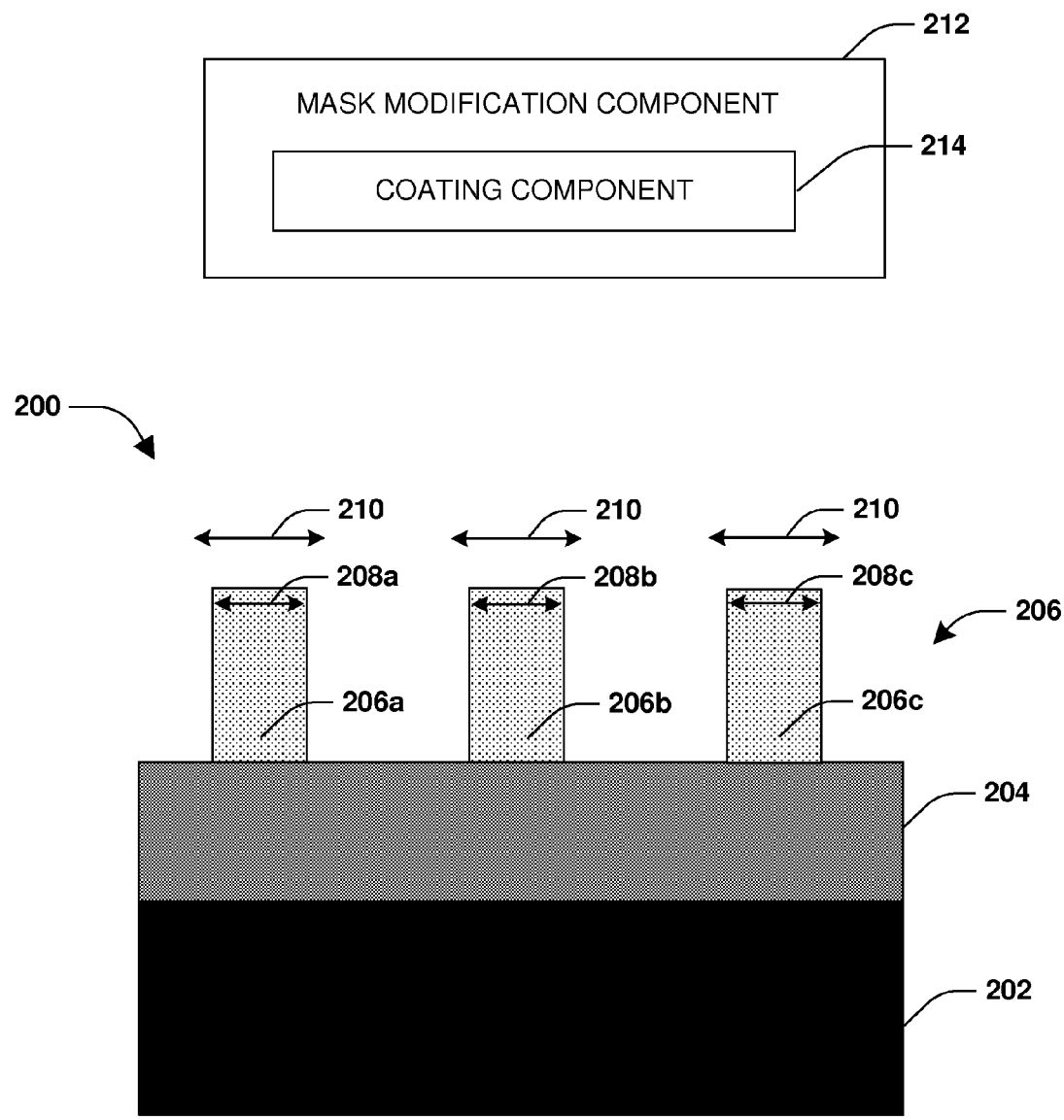
FIG. 2A is an illustration of a hard mask formed over a layer, in accordance with some embodiments.

FIGS. 2A-2D illustrate a system for reshaping a hard mask 206. The system comprises a mask modification component 212 comprising a coating component 214. The mask modification component 212 is configured to identify the hard mask 206 formed over a layer 204 of a semiconductor arrangement 200, as illustrated in FIG. 2A. In some embodiments, the layer 204 comprises a poly material used to form one or more gate structures over a substrate 202 of the semiconductor arrangement 200. The hard mask 206 comprises one or more hard mask portions, such as a first hard mask portion 206a, a second hard mask portion 206b, and a third hard mask portion 206c.

The mask modification component 212 is configured to evaluate dimensions of the one or more hard mask portions based upon a target dimension, such as a target width dimension 210, as illustrated in FIG. 2A. In some embodiments, the target width dimension 210 corresponds to a gate width constraint specified for poly gate structures that are to be formed from the layer 204 for the semiconductor arrangement 200. In some embodiments, the mask modification component 212 determines that a first width dimension 208a of the first hard mask portion 206a, a second width dimension 208b of the second hard mask portion 206b, and a third width dimension 208c of the third hard mask portion 206c do not correspond to the target width dimension 210. In some embodiments, the mask modification component 212 determines that the first width dimension 208a, the second width dimension 208b, and the third width dimension 208c are smaller than the target width dimension 210.

Figure 2B:
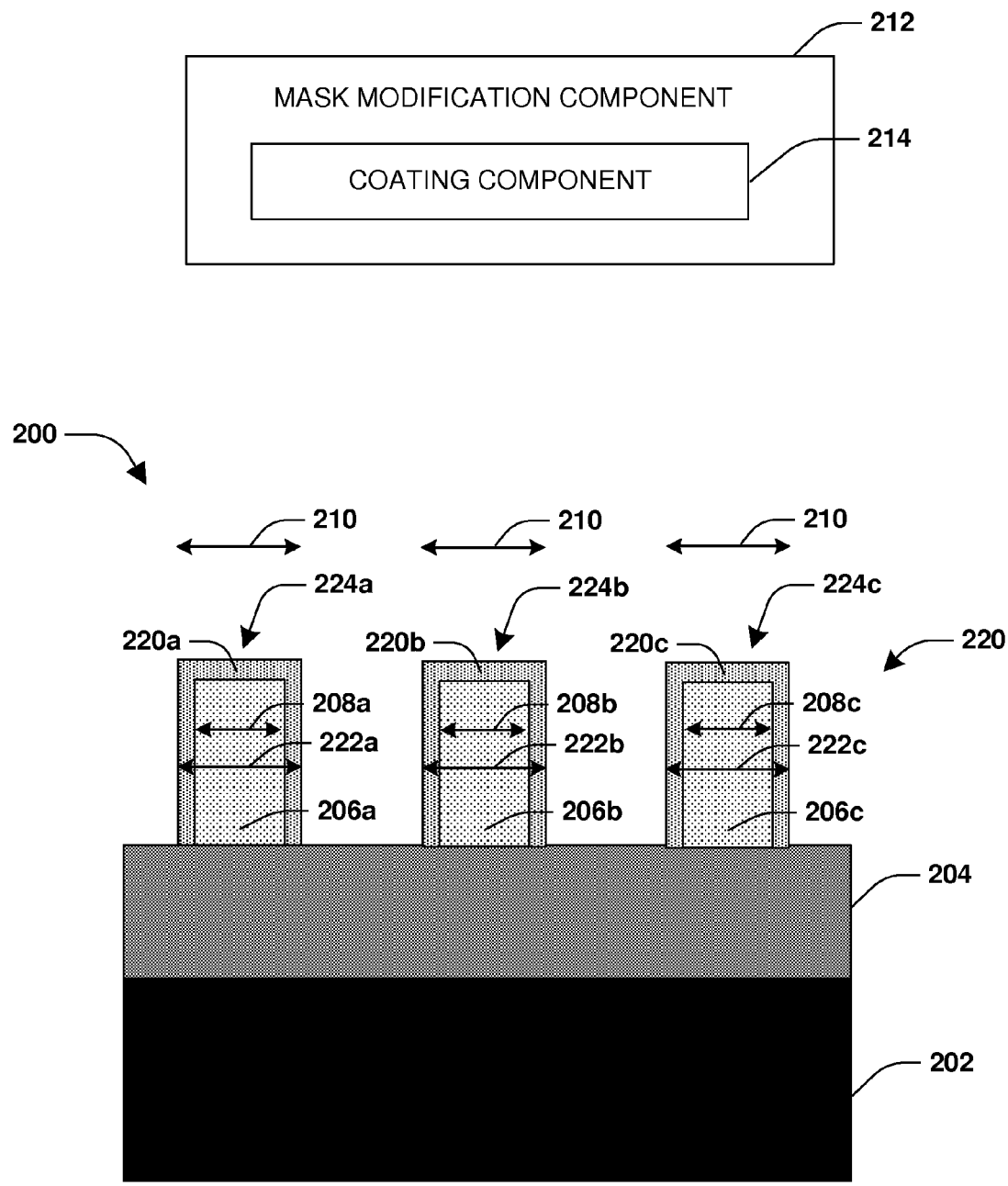
FIG. 2B is an illustration of a coated hard mask, in accordance with some embodiments.

The coating component 214 is configured to apply a coating material 220 over the first hard mask portion 206a, the second hard mask portion 206b, and the third hard mask portion 206c, as illustrated in FIG. 2B. In some embodiments, the coating material comprises Si3N4, SiO2, Carbon, or other polymer formation. A first coating 220a is applied to the first hard mask portion 206a to form a first coated hard mask portion 224a. A second coating 220b is applied to the second hard mask portion 206b to form a second coated hard mask portion 224b. A third coating 220c is applied to the third hard mask portion 206c to form a third coated hard mask portion 224c. The first coated hard mask portion 224a has a first coated dimension 222a that corresponds to the target width dimension 210. The second coated hard mask portion 224b has a second coated dimension 222b that corresponds to the target dimension width 210. The third coated hard mask portion 224c has a third coated dimension 222c that corresponds to the target dimension width 210.

Figure 2C:
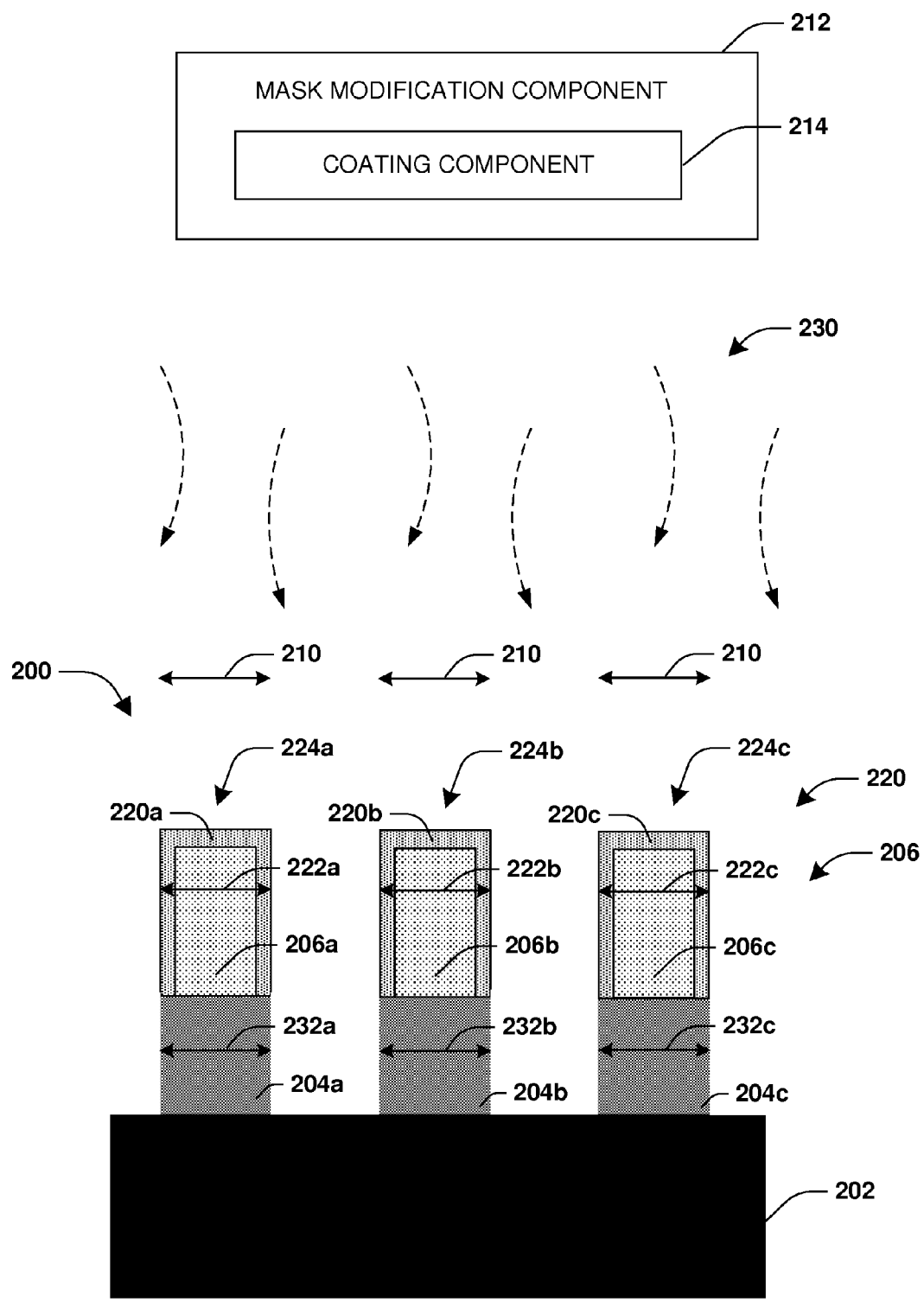
FIG. 2C is an illustration of performing an etch through a coated hard mask, in accordance with some embodiments.
Figure 2D:
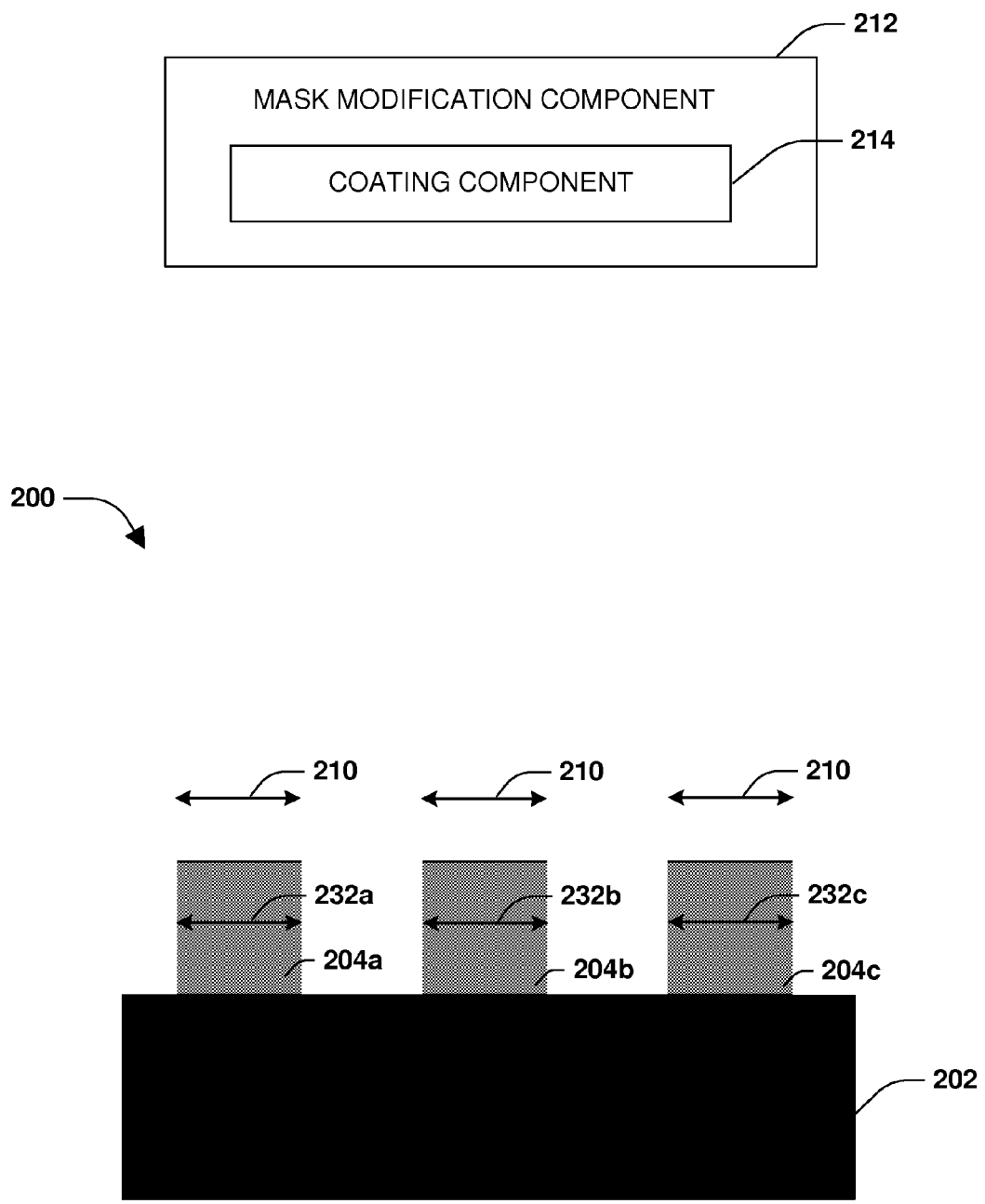
FIG. 2D is an illustration of an etched layer, in accordance with some embodiments.

The mask modification component 212 is configured to perform an etch 230 through the coated hard mask, such as between the first coated hard mask portion 224a, the second coated hard mask portion 224b, and the third coated hard mask portion 224c, to etch the layer 204 to create an etched layer, as illustrated in FIG. 2C. The etched layer comprises a first etched portion 204a, a second etched portion 204b, and a third etched portion 204c. The first etched portion 204a has a first etched width dimension 232a corresponding to the target width dimension 210. The second etched portion 204b has a second etched width dimension 232b corresponding to the target width dimension 210. The third etched portion 204c has a third etched width dimension 232c corresponding to the target width dimension 210. In this way, the etched layer is formed according to spec, such as according to the target width dimension 210, as illustrated in FIG. 2D.

Figure 3:
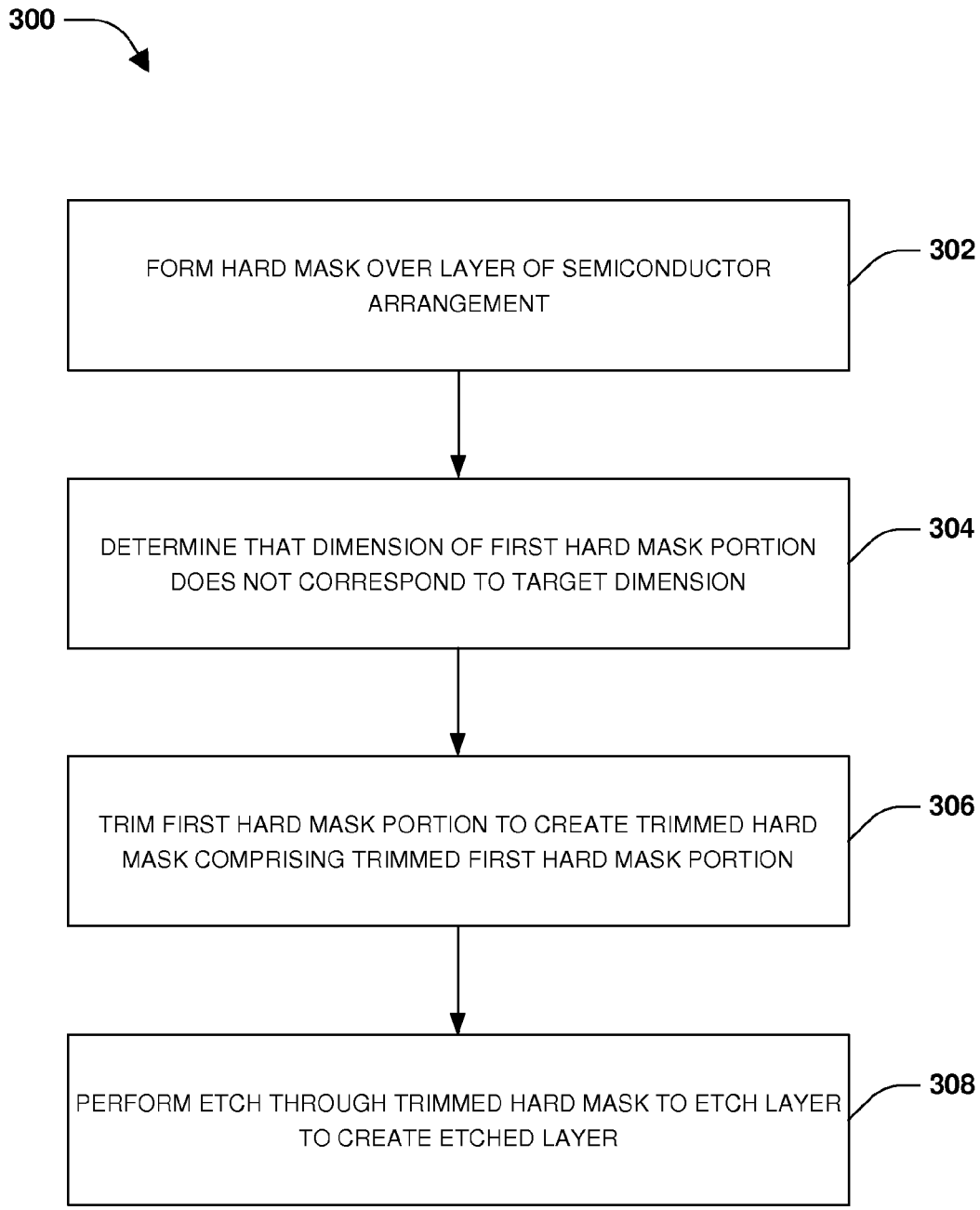
FIG. 3 is a flow diagram illustrating a method of reshaping a hard mask, in accordance with some embodiments.

A method 300 of reshaping a hard mask is illustrated in FIG. 3. At 302, a hard mask is formed over a layer of a semiconductor arrangement. The hard mask comprises one or more hard mask portions, such as a first hard mask portion. The hard mask is used in conjunction with one or more etching processes, such as a single patterning etch, a double patterning etch, or a multiple patterning etch, to define and form one or more structures from material of the layer. At 304, a dimension of the first hard mask portion is determined as not corresponding to a target dimension. In some embodiments, the dimension is determined as being larger than the target dimension. In some embodiments, the target dimension corresponds to a design constraint, such as a width constraint, a length constraint, or a spacing constraint between structures. If the dimension of the first hard mask portion does not correspond to the target dimension, then an etching process will incorrectly form one or more structures that do not match/satisfy the target dimension.

At 306, the first hard mask portion is trimmed to create a trimmed hard mask comprising a trimmed first hard mask portion. In some embodiments, a critical dimension etch back (CDEB) technique is performed to trim the first hard mask portion. In some embodiments, a plasma etch is performed to trim the first hard mask portion. In some embodiments, the trimming comprises at least one of a single pattern etch, a double pattern etch, or a multi-pattern etch. In some embodiments, the trimming is performed in-situ, such as in an etching chamber within which the layer is to be etched or a chamber within which the layer or hard mask was formed. In some embodiments, the coating material is applied ex-situ such as in a coating chamber.

At 308, responsive to determine that a trimmed dimension of the trimmed first hard mask portion corresponds to the target dimension, an etch is performed through the trimmed hard mask to etch the layer to create an etched layer. The etched layer, such as a structure formed by remaining material of the etched layer, has an etch layer dimension corresponding to the target dimension. In this way, one or more structures are formed within the etched layer according to spec, such as according to the target dimension.

Figure 4A:
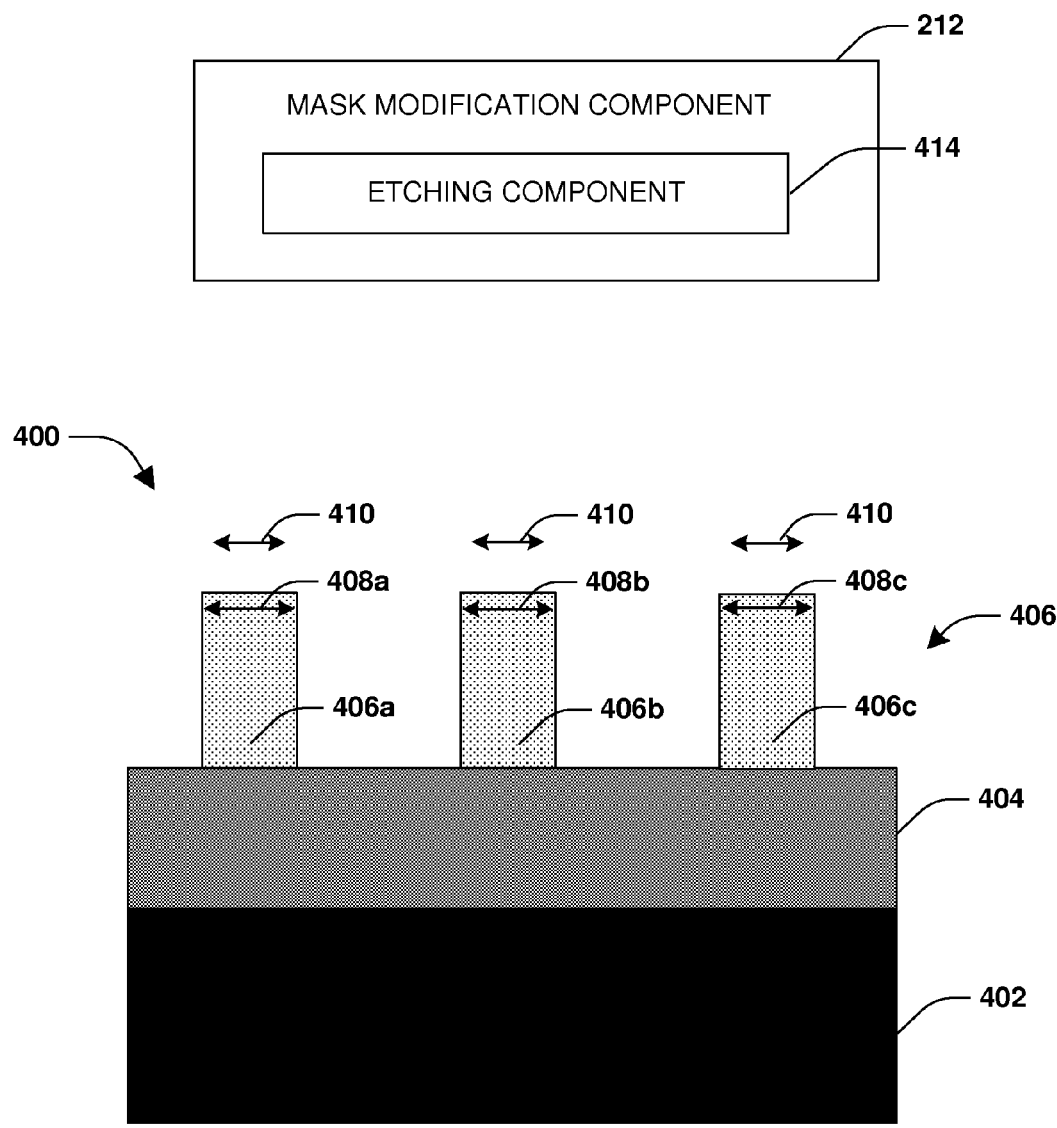
FIG. 4A is an illustration of a hard mask formed over a layer, in accordance with some embodiments.

FIGS. 4A-4D illustrate a system for reshaping a hard mask 406. The system comprises a mask modification component 212 comprising an etching component 414. The mask modification component 212 is configured to identify the hard mask 406 formed over a layer 404 of a semiconductor arrangement 400, as illustrated in FIG. 4A. In some embodiments, the layer 404 comprises a poly material used to form one or more gate structures over a substrate 402 of the semiconductor arrangement 400. The hard mask 406 comprises one or more hard mask portions, such as a first hard mask portion 406a, a second hard mask portion 406b, and a third hard mask portion 406c.

The mask modification component 212 is configured to evaluate dimensions of the one or more hard mask portions based upon a target dimension, such as a target width dimension 410, as illustrated in FIG. 4A. In some embodiments, the target width dimension 410 corresponds to a gate width constraint specified for poly gate structures that are to be formed from the layer 204 for the semiconductor arrangement 200. In some embodiments, the mask modification component 212 determines that a first width dimension 408a of the first hard mask portion 406a, a second width dimension 408b of the second hard mask portion 406b, and a third width dimension 408c of the third hard mask portion 406c do not correspond to the target width dimension 410. In some embodiments, the mask modification component 212 determines that the first width dimension 408a, the second width dimension 408b, and the third width dimension 408c are larger than the target width dimension 410.

Figure 4B:
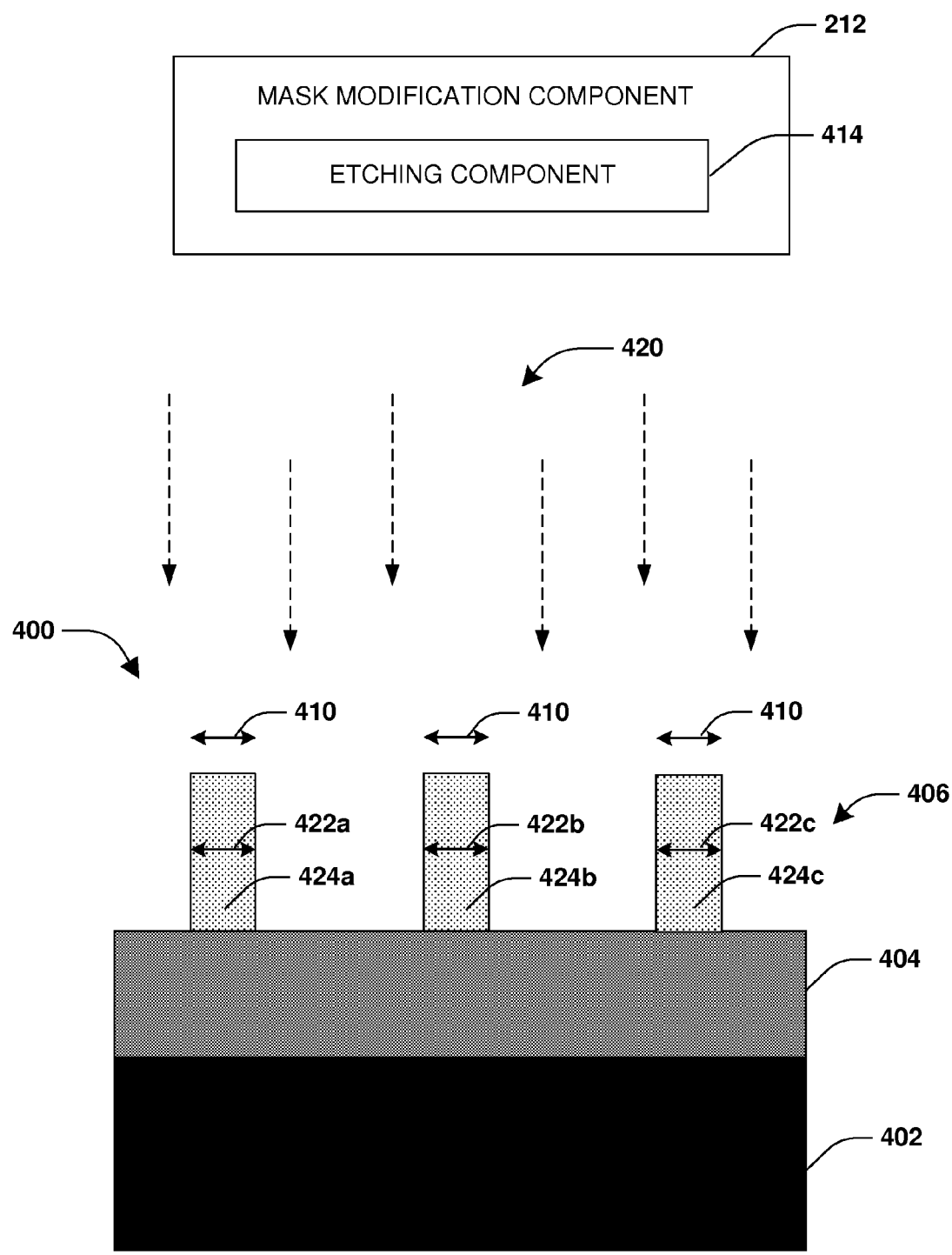
FIG. 4B is an illustration of a trimmed hard mask, in accordance with some embodiments.

The etching component 414 is configured to trim 420 one or more hard mask portions, as illustrated in FIG. 4B. The etching component 414 is configured to trim 420 the first hard mask portion 406a to create a trimmed first hard mask portion 424a having a first trimmed width dimension 422a corresponding to the target width dimension 410. The etching component 414 is configured to trim 420 the second hard mask portion 406b to create a trimmed second hard mask portion 424b having a second trimmed width dimension 422b corresponding to the target width dimension 410. The etching component 414 is configured to trim 420 the third hard mask portion 406c to create a trimmed third hard mask portion 424c having a third trimmed width dimension 422c corresponding to the target width dimension 410.

Figure 4C:
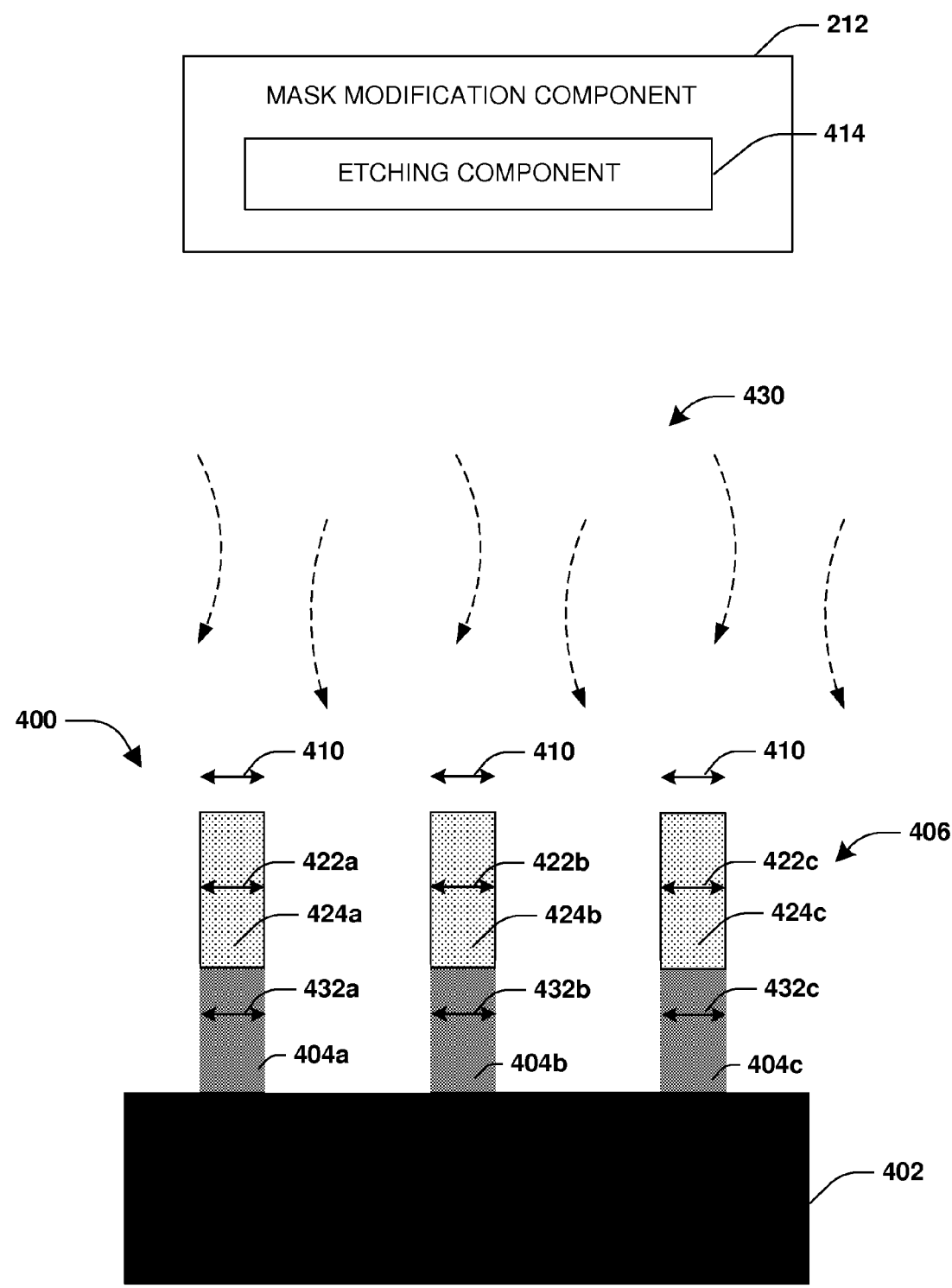
FIG. 4C is an illustration of performing an etch through a trimmed hard mask, in accordance with some embodiments.
Figure 4D:
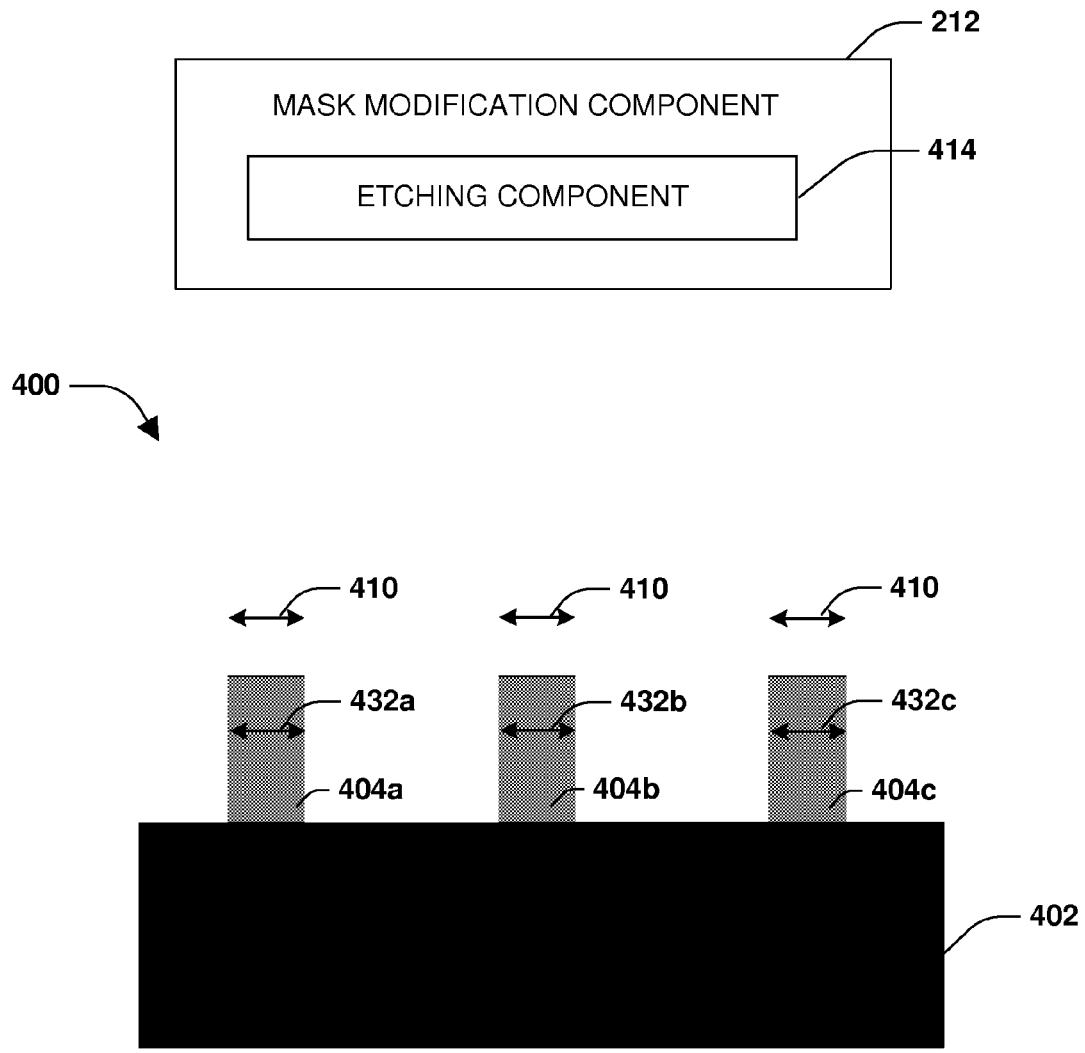
FIG. 4D is an illustration of an etched layer, in accordance with some embodiments.

The mask modification component 212 is configured to perform an etch 430 through the trimmed hard mask, such as between the first trimmed hard mask portion 424a, the second trimmed hard mask portion 424b, and the third trimmed hard mask portion 424c, to etch the layer 404 to create an etched layer, as illustrated in FIG. 4C. The etched layer comprises a first etched portion 404a, a second etched portion 404b, and a third etched portion 404c. The first etched portion 404a has a first etched width dimension 432a corresponding to the target width dimension 410. The second etched portion 404b has a second etched width dimension 432b corresponding to the target width dimension 410. The third etched portion 404c has a third etched width dimension 432c corresponding to the target width dimension 410. In this way, the etched layer is formed according to spec, such as according to the target width dimension 410, as illustrated in FIG. 4D.

Figure 5:
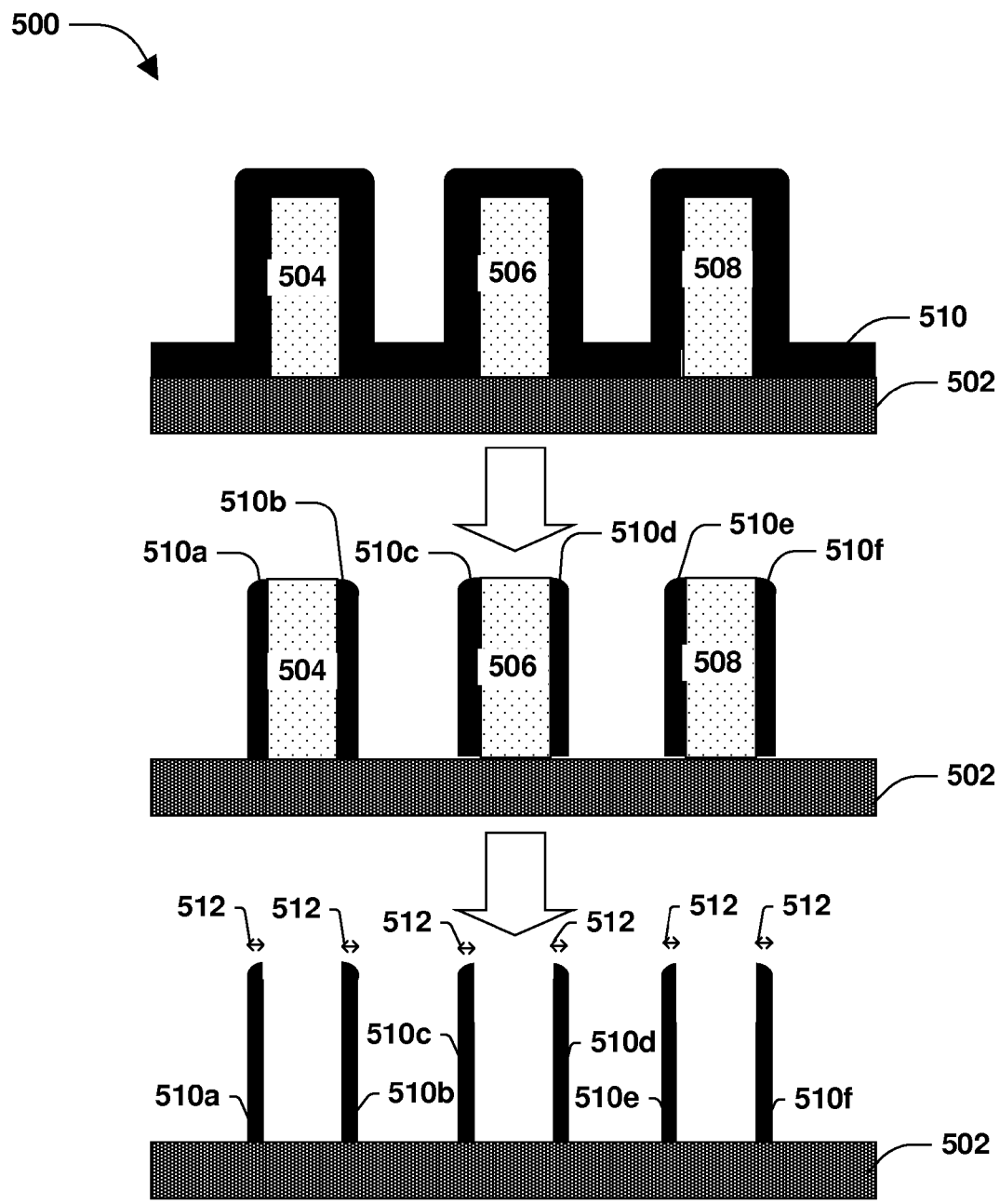
FIG. 5 is an illustration of a critical dimension pull back (CDPB) technique, in accordance with some embodiments.

FIG. 5 illustrates a critical dimension pull back (CDPB) technique. A semiconductor arrangement 500, such as a FinFET or other relatively small dimension technology, comprises a first structure 504, a second structure 506, and a third structure 508 formed over a substrate 502. A coating layer 510 is formed over the substrate 502, the first structure 504, the second structure 506, and the third structure 508. At least some of the coating layer 510 is trimmed to form a first coating structure 510a and a second coating structure 510b for the first structure 504, a third coating structure 510c and a fourth coating structure 510d for the second structure 506, and a fifth coating structure 510e and a sixth coating structure 510f for the third structure 508. An etching process is performed to remove the first structure 504, the second structure 506, and the third structure 508. In this way, the semiconductor arrangement 500 comprises the first coating structure 510a, the second coating structure 510b, the third coating structure 510c, the fourth coating structure 510d, the fifth coating structure 510e, and the sixth coating structure 510f having a critical dimension 512.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a method for reshaping a hard mask is provided. The method comprises a forming a hard mask over a layer of a semiconductor arrangement. The hard mask comprises a first hard mask portion. A determination is made that the first hard mask portion does not correspond to a target dimension. A coating material is applied over the first hard mask portion to create a coated hard mask comprising a coated first hard mask portion. Responsive to a coated dimension of the coated first hard mask portion corresponding to the target dimension, performing an etch through the coated hard mask to etch the layer to create an etched layer.

According to an aspect of the instant disclosure, a method for reshaping a hard mask is provided. The method comprises a forming a hard mask over a layer of a semiconductor arrangement. The hard mask comprises a first hard mask portion. A determination is made that the first hard mask portion does not correspond to a target dimension. The first hard mask is trimmed to create a trimmed hard mask comprising a trimmed hard mask portion. Responsive to a trimmed dimension of the trimmed first hard mask portion corresponding to the target dimension, performing an etch through the trimmed hard mask to etch the layer to create an etched layer.

According to an aspect of the instant disclosure, a system for reshaping a hard mask is provided. The system comprises a mask modification component. The mask modification component is configured to identify a hard mask formed over a layer of a semiconductor arrangement. The hard mask comprises a first hard mask portion. The mask modification component is configured to determine that a dimension of the first hard mask portion does not correspond to a target dimension. The mask modification component is configured to modify the first hard mask portion to create a modified hard mask comprising a modified first hard mask portion. Responsive to a modified dimension of the modified first hard mask portion corresponding to the target dimension, the mask modification component performs an etch through the modified hard mask to etch the layer to create an etched layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for reshaping a hard mask, comprising:
   forming a hard mask over a layer of a semiconductor arrangement, the hard mask comprising a first hard mask portion;
   evaluating whether a dimension of the first hard mask portion corresponds to a target dimension;
   when the dimension of the first hard mask portion is less than the target dimension, applying a coating material over the first hard mask portion to create a coated hard mask comprising a coated first hard mask portion; and
   responsive to a coated dimension of the coated first hard mask portion corresponding to the target dimension, performing an etch through the coated hard mask to etch the layer to create an etched layer.

2. The method of claim 1, when the dimension of the first hard mask portion is greater than the target dimension, etching the hard mask to reduce the dimension of the first hard mask portion.

3. The method of claim 1, the forming a hard mask comprising:
   performing an initial etch of an initial hard mask to form the hard mask.

4. The method of claim 1, the etched layer having an etched layer dimension corresponding the target dimension.

5. The method of claim 1, comprising:
   trimming the coated first hard mask portion based upon the target dimension.

6. The method of claim 1, the layer comprising at least one of a source material, a drain material, poly, a metal, oxide, or silicon nitride.

7. The method of claim 1, the coating material comprising at least one of Si3Ni4, SiO2, Carbon, USG, PSG, or a polymer.

8. The method of claim 1, the semiconductor arrangement comprising a Fin FET.

9. The method of claim 5, the trimming comprising:
   performing a plasma etch to trim the coated first hard mask portion.

10. The method of claim 1, the applying a coating material performed in-situ or ex-situ.

11. The method of claim 1, the applying a coating material comprising:
    performing a critical dimension pull back (CDPB) technique.

12. A system for reshaping a hard mask, comprising:
    a mask modification component configured to:
      identify a hard mask formed over a layer of a semiconductor arrangement, the hard mask comprising a first hard mask portion;
      evaluate whether a dimension of the first hard mask portion corresponds to a target dimension;
      when the dimension of the first hard mask portion is less than the target dimension, modify the first hard mask portion to create a modified hard mask comprising a modified first hard mask portion having a modified dimension, the modified dimension of the modified first hard mask portion greater than the dimension of the first hard mask portion; and
      responsive to the modified dimension of the modified first hard mask portion corresponding to the target dimension, perform an etch through the modified hard mask to etch the layer to create an etched layer.

13. The system of claim 12, the mask modification component comprising:
an etching component configured to:
perform a critical dimension etch back (CDEB) technique to trim the first hard mask portion.

14. The system of claim 12, the mask modification component comprising:
a coating component configured to:
perform a critical dimension pull back (CDPB) technique to coat the first hard mask portion with a coating material.

15. A method for reshaping a hard mask, comprising:
forming a hard mask over a layer of a semiconductor arrangement, the hard mask comprising a first hard mask portion;
determining that a dimension of the first hard mask portion is less than a target dimension of the first hard mask portion;
applying a coating material over the first hard mask portion to create a coated hard mask comprising a coated first hard mask portion;
determining that a coated dimension of the coated first hard mask portion is greater than the target dimension;
trimming the coated first hard mask portion based upon the target dimension to reduce the coated dimension of the coated first hard mask portion; and
responsive to the coated dimension of the coated first hard mask portion corresponding to the target dimension, performing an etch through the coated hard mask to etch the layer to create an etched layer.

16. The method of claim 15, the coating material comprising $SiO_2$.

17. The method of claim 15, the coating material comprising $Si_3Ni_4$.

18. The method of claim 15, the applying comprising applying the coating material in-situ.

19. The method of claim 15, the applying comprising applying the coating material ex-situ.

20. The method of claim 15, the applying comprising applying the coating material using plasma.

* * * * *